(12) United States Patent
Ruha et al.

(10) Patent No.: US 6,535,155 B2
(45) Date of Patent: Mar. 18, 2003

(54) METHOD AND APPARATUS FOR SUPPRESSING TONES INDUCED BY CYCLIC DYNAMIC ELEMENT MATCHING (DEM) ALGORITHMS

(75) Inventors: Antti Ruha, Oulu (FI); Tarmo Ruotsalainen, Oulu (FI); Jussi-Pekka Tervaluoto, Oulu (FI); Jani Kauppinen, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/892,971

(22) Filed: Jun. 27, 2001

(65) Prior Publication Data

US 2003/0001764 A1 Jan. 2, 2003

(51) Int. Cl.$^7$ .......................... H03M 1/10; H03M 1/66; H03M 3/00

(52) U.S. Cl. ...................... 341/144; 341/120; 341/143

(58) Field of Search ................................. 341/120, 143, 341/144, 155, 172, 118, 150, 161; 326/37; 375/252; 323/316

(56) References Cited

U.S. PATENT DOCUMENTS

| | | | |
|---|---|---|---|
| 5,144,308 A | | 9/1992 | Norsworthy |
| 5,305,004 A | * | 4/1994 | Fattaruso .................... 341/120 |
| 5,406,283 A | * | 4/1995 | Leung ........................ 341/143 |
| 5,745,061 A | | 4/1998 | Norsworthy et al. |
| 5,889,482 A | | 3/1999 | Zarubinsky et al. |
| 5,990,815 A | | 11/1999 | Linder et al. |
| 5,990,819 A | | 11/1999 | Fujimori |
| 6,011,501 A | | 1/2000 | Gong et al. |
| 6,087,969 A | | 7/2000 | Stockstad et al. |
| 6,359,467 B1 | * | 3/2002 | McCarroll et al. ............ 326/37 |
| 6,369,733 B1 | * | 4/2002 | Tucker et al. ................ 341/143 |
| 6,384,761 B1 | * | 5/2002 | Melanson .................... 341/143 |

FOREIGN PATENT DOCUMENTS

| | | |
|---|---|---|
| WO | WO 98/44626 | 10/1998 |

OTHER PUBLICATIONS

Leung et al., Multibit Sigma–Delta A/D Converter Incorporating A Novel Class of Dynamic Element Matching Techniques, IEEE Transactions on Circuits and Systems–II, Analog and Digital Signal Processing, vol. 39, No. 1, 1/92.

Baird et al., Linearity Enhancement of Multibit Sigma–Delta A/D and D/a Converters Using Data Weighted Averaging, IEEE Transactions on Circuits and Systems–II: Analog and Digital Signal Processing, vol. 42, No. 12, 12/95.

Carley, A Noise Shaping Coder Topology for 15+ Bit Converters, IEEE Journal of Solid State Circuits, vol. 24, No. 2, 4/89.

(List continued on next page.)

*Primary Examiner*—Patrick Wamsley
(74) *Attorney, Agent, or Firm*—Harrington & Smith, LLP

(57) ABSTRACT

Disclosed is a method and apparatus for performing Dynamic Element Matching (DEM). The method operates to input a plurality of digital values and, for each value, to generate a plurality of N signals individual ones of which are intended to drive one of a plurality of N elements. The plurality of signals are generated so as to average the usage of individual ones of the N elements over time. The method further periodically rearranges the plurality of N signals so as to suppress the generation of undesired periodicities or tones in the usage of the N elements, and without affecting the averaging of the usage of the N elements. Preferably the periodic rearrangement occurs only at a time when the usage of the N elements is indicated as being averaged using, for example, an enable signal that is input to a secondary DEM block from a primary DEM block. The plurality of N signals are preferably generated by the primary DEM block using a cyclic DEM algorithm, such as a Data Weighted Averaging (DWA) algorithm or a rotation-based Clocked Averaging (CLA) algorithm, and the periodic rearrangement performed by the secondary DEM block is preferably based on randomization or pseudo-randomization.

20 Claims, 6 Drawing Sheets

OTHER PUBLICATIONS

Multibit Σ–Δ A/D Converter Incorporating A Novel Class of Dynamic Element Matching Techniques; Leung, Bosco H et al; IEEE Transactions on Circuits and Systems II Analog and Digital Signal Processing, vol. 39 No. 1; Jan. 1992.

Linearity Enhancement of Multibit ΔΣ A/D and D/A Converters Using Data Weighted Averaging; Baird, Rex T. et al; IEEE Transactions on Circuits and Systems II Analog and Digital Signal Processing, vol. 42 No. 12; Dec. 1995.

A Noise–Shaping Coder Topology for 15+ Bit Converters, Carley, L. Richard; IEEE Journal of Solid–State Circuits, vol. 24, No. 2; Apr. 1989.

* cited by examiner

| TIMESTEP T: | INPUT DATA SEQUENCE: | PTR: | MISMATCH ERROR IN DWA: | MISMATCH ERROR IN DWA+RANDOMIZING: |
|---|---|---|---|---|
| 1 | 000011 | 1 | Δe1+Δe2 | Δe1+Δe2 |
| 2 | 000111 | 3 | Δe3+Δe4+Δe5 | Δe3+Δe4+Δe5 |
| 3 | 000001 | 6 | Δe6 | Δe6 |
| ..... | ..... | ..... | ..... | ..... |
| 4 | 000011 | 1 | Δe1+Δe2 | Δe3+Δe1 |
| 5 | 000111 | 3 | Δe3+Δe4+Δe5 | Δe2+Δe6+Δe5 |
| 6 | 000001 | 6 | Δe6 | Δe4 |

INTEGRAL MISMATCH IN BOTH CASES:
2*(Δe1+ Δe2+ Δe3+ Δe4+ Δe5+ Δe6)

ELEMENT ORDER REARRANGED BY SECONDARY DEM ALGORITHM

FIG.4

WITHOUT DWA

WITH DWA (TONES ARE CIRCLED)

DWA WITH SECONDARY DEM (NO TONES)

METHOD AND APPARATUS FOR SUPPRESSING TONES INDUCED BY CYCLIC DYNAMIC ELEMENT MATCHING (DEM) ALGORITHMS

FIELD OF THE INVENTION

These teachings relate generally to multi-bit sigma-delta modulators (SDMs) and to analog-to-digital converters (ADCs) and digital-to-analog converters (DACs) that employ SDMs and, more specifically, relate to Dynamic Element Matching (DEM) algorithms and methods.

BACKGROUND OF THE INVENTION

It is known to use Dynamic Element Matching (DEM) techniques in the context of sigma-delta converters and 1-bit data formats. Reference in this regard can be had to, for example, U.S. Pat. No.: 5,990,819, "D/A converter and delta-sigma D/A converter", by Fujimori and to U.S. Pat. No.: 6,011,501, "Circuits, systems and methods for processing data in a one-bit format", by Gong et al. Dynamic element matching and sigma-delta modulator techniques are both well known in the art.

Single-bit SDMs are widely used in ADCs for the reason that they do not require accurate components, and can thus be readily implemented using modern CMOS integrated circuit processes. The single-bit DAC in the feedback loop is also readily implemented, as it is an inherently linear device. However, in order to obtain a wide dynamic range the single-bit SDM requires a high oversampling ratio (OSR) and/or a high modulator order, which typically requires a prohibitively large integrated circuit area and/or excessive power consumption to realize.

For stability reasons the dynamic range cannot be increased above a certain limit, at a low OSR, by simply increasing the modulator order. However, the dynamic range can be increased, without increasing the OSR or the modulator order, by increasing the number of quantization levels, i.e., by using a multi-bit SDM. The multi-bit SDM requires the use of a multi-bit DAC in the feedback loop.

However, multi-bit DACs are not inherently linear, and to achieve high accuracy (e.g., more than about 10 bits), either calibration or dynamic element matching (DEM) is often required.

A problem that is created by the use of some DEM algorithms, in particular a cyclic DEM algorithm, is a tonal behavior due to a limit cycle oscillation of the DEM in a multi-bit DAC application. Multi-bit DACs are used as basic building blocks in both oversampled ADCs and DACs.

The general structure of the multi-bit DAC 1 (without DEM), based on the use of thermometer coding, is shown in FIG. 1. Each bit of the digital thermometer input code (M bits, where $M=2^N-1$) is converted into an analog signal by switching corresponding analog unit elements 2. The analog signals output by the unit elements 2 are summed at node 3 to form an analog output signal of the DAC 1. Unit elements are any circuit element that can be used for converting a digital signal to an analog form, i.e., a current, charge or voltage. For example, in a current steering DAC the unit elements are current sources or current mirrors, while in a switched capacitor DAC the unit elements are capacitors. Resistors can also be used as unit element implementations.

A significant disadvantage of the multi-bit DAC 1 shown in FIG. 1 is that variations between the unit elements 2, i.e., the mismatch error introduces nonlinearity into the digital to analog conversion. Through the use of a DEM algorithm this non-linearity can be converted to wide-band noise, or it can be concentrated into certain frequency bands by controlling the usage of the unit elements 2. All DEM algorithms are based on averaging the integral error in DA conversion due to the unit element mismatch error by averaging the use of the unit elements 2. Depending on the DEM algorithm efficiency, the power spectral density of the wide-band noise can be further shaped so that most of the noise is shifted outside of the signal band of interest. This principle of mismatch noise shaping is similar to noise shaping in SDMs.

FIG. 2 is a simplified block diagram of a conventional multi-bit DAC 5 that includes a switching matrix 6 controlled by a DEM algorithm block 7. The DEM block 7 could be, for example, one based on data weighted averaging (DWA) or rotation, such as clocked averaging (CLA). The feedback path from the output of the switching matrix 6, or from the outputs of the unit elements 2 (not shown), is required only for those DEM algorithms that maintain a record of the actual usage of the unit elements 2. The feedback path is generally required for noise shaping DEM algorithms.

General reference with regard to DWA may be had to a publication: Rex T. Baird, Terry S. Fiez, Linearity Enhancement of Multibit $\Delta\Sigma$ A/D and D/A Converters Using Data Weighted Averaging, IEEE Transactions on Circuits and Systems—II: Analog and Digital Signal Processing, Vol. 42, No. 12, December 1995, and with regard to CLA reference can be made to Y. Sakina, Multibit $\Sigma$-$\Delta$ Analog to Digital Converters with Nonlinearity Correction Using Dynamic Barrel Shifting, M.A.Sc thesis, ERL, Univ. California at Berkeley, 1990.

The operational principle of averaging algorithms is shown in FIGS. 5A and 5B, which plot power spectral density (dB) versus frequency. More particularly, these Figures illustrate the performance comparison of different DEM algorithms in an ADC based on a $3^{rd}$ order SDM with an 8-level internal DAC in the ADC feedback path. FIG. 5A shows the case of random data averaging (RDA) without DWA, while FIG. 5B shows the case of DWA. The undesirable generated tones are circled in FIG. 5B. General reference with regard to RDA can be made to a publication: L. Richard Carley, A Noise-Shaping Coder Topology for 15+Bit Converters, IEEE Journal of Solid-State Circuits, Vol. 24. No. 2, April 1989.

In cyclic DEM algorithms, such as rotation based clocked averaging (CLA) and DWA, the DAC mismatch error is converted into wide-band noise, but disadvantageously also exhibits periodic signal components, i.e., tones, at certain frequencies. This tonal behavior is found as well in other noise-shaping DEM algorithms, although the amplitude of the tones is generally less. The generation of tones is undesirable as they tend to degrade the spurious free dynamic range, demodulate out-of-band noise to the desired signal band, and also disturb signals in the desired signal band. The tones may also become audible in an audio converter application, even when they are below the noise floor. In general, the DWA algorithm contains first order noise shaping, while the CLA algorithm has a white noise floor.

It has been known in the art to modify the DWA algorithm in an attempt to control tonal behavior. Known types of modifications are: (a) adding a dither signal to the DWA algorithm, (b) using the rotated data weighted averaging (RDWA) algorithm; and (c) the use of additional unit elements. The modifications (a) and (b) serve to decompose the unwanted tones, while the modification (c) shifts the tones in frequency, but does not decompose them.

However, there are drawbacks to the use of these conventional techniques. For example, adding the dither signal has the disadvantage of increasing the noise floor. Additionally, in the DWA algorithm the dither signal also introduces the white noise floor near DC, which has the effect of removing the first order noise shaping at low frequencies, and thus degrades overall performance.

With regard to the RDWA algorithm, various sequences are present that are changed occasionally. In higher level DACs the number of possible sequences produces unmanageable complexity, and thus the total number of possible sequences must be limited. Furthermore, too frequent switching of the sequences increases the noise floor at frequencies near DC significantly. The approach of adding additional unit elements increases both the required circuit area and the power consumption, both of which are undesirable.

Tone cancellation is important in high resolution RF and audio converters, where the use of the DWA and other noise-shaping DEM algorithms is usually desired to achieve a high dynamic range. As such, it can be appreciated that it is very desirable to suppress or cancel the generation of tones in order to obtain a high signal to noise and distortion ratio (SNDR) and spurious free dynamic range (SFDR), and to do so without incurring the problems that arise in conventional approaches to tonal cancellation.

SUMMARY OF THE INVENTION

The foregoing and other problems are overcome by methods and apparatus in accordance with embodiments of these teachings. These teachings provide a technique to suppress or cancel the generation of tones for cyclic DEM algorithms, such as the DWA and CLA algorithms. The circuitry can be implemented entirely in the digital domain, thereby making the incorporation of these teachings into integrated circuit applications particularly straightforward. These teachings also do not require an increase in the number of analog circuit components, thereby conserving integrated circuit area and power consumption.

The preferred method and apparatus is based on a two step or two stage DEM algorithm. The primary DEM algorithm is preferably a cyclic algorithm that converts the mismatch distortion to wide-band noise and tones, while the secondary DEM algorithm converts the tones to wide-band noise. The secondary DEM algorithm does not decompose the averaging performed by the primary DEM algorithm, and thus the noise shaping of the primary DEM algorithm is preserved.

In the preferred embodiment a connection between the primary DEM algorithm processor block and the unit elements is randomized within a switching matrix of the secondary DEM algorithm. The operation of the secondary DEM algorithm is synchronized to the operation the primary DEM algorithm, and thus the random switching applied by the secondary DEM algorithm does not decompose the averaging of the primary DEM algorithm. In this manner the noise shaping and the long term averaging applied by the primary DEM algorithm is preserved, and the white noise floor near DC does not occur. These are important considerations in maintaining the performance of the DWA algorithm.

The operation of the improved DEM technique in accordance with these teachings converts the unwanted tones to noise-shaped wide-band noise, and does not simply shift the unwanted tones to frequencies outside of the signal band of interest. As a result, the out-of-band noise is not demodulated into the signal band of interest due to the high frequency tones produced by the DEM algorithm. The noise shaping of the primary DEM algorithm is also preserved, without introducing the white noise floor. This is because the switching of the secondary DEM algorithm is synchronized to the primary DEM algorithm, resulting in a preservation of the long term averaging afforded by the primary DEM algorithm.

A further advantage realized by the practice of these teachings is that a simple implementation of the first order noise shaping of the DWA algorithm is achieved, without requiring a significant increase in circuit area due to sorting circuitry that is typically required in pure noise shaping algorithms.

BRIEF DESCRIPTION OF THE DRAWINGS

The above set forth and other features of these teachings are made more apparent in the ensuing Detailed Description of the Preferred Embodiments when read in conjunction with the attached Drawings, wherein:

FIG. 4 is a diagram that contrasts conventional DWA and the DWA with tone cancellation in accordance with these teachings;

FIG. 5A shows the case of random data averaging (RDA), and where FIG. 5B shows the case of DWA;

DETAILED DESCRIPTION OF THE PREFERRED EMBODIMENTS

Figure 1:
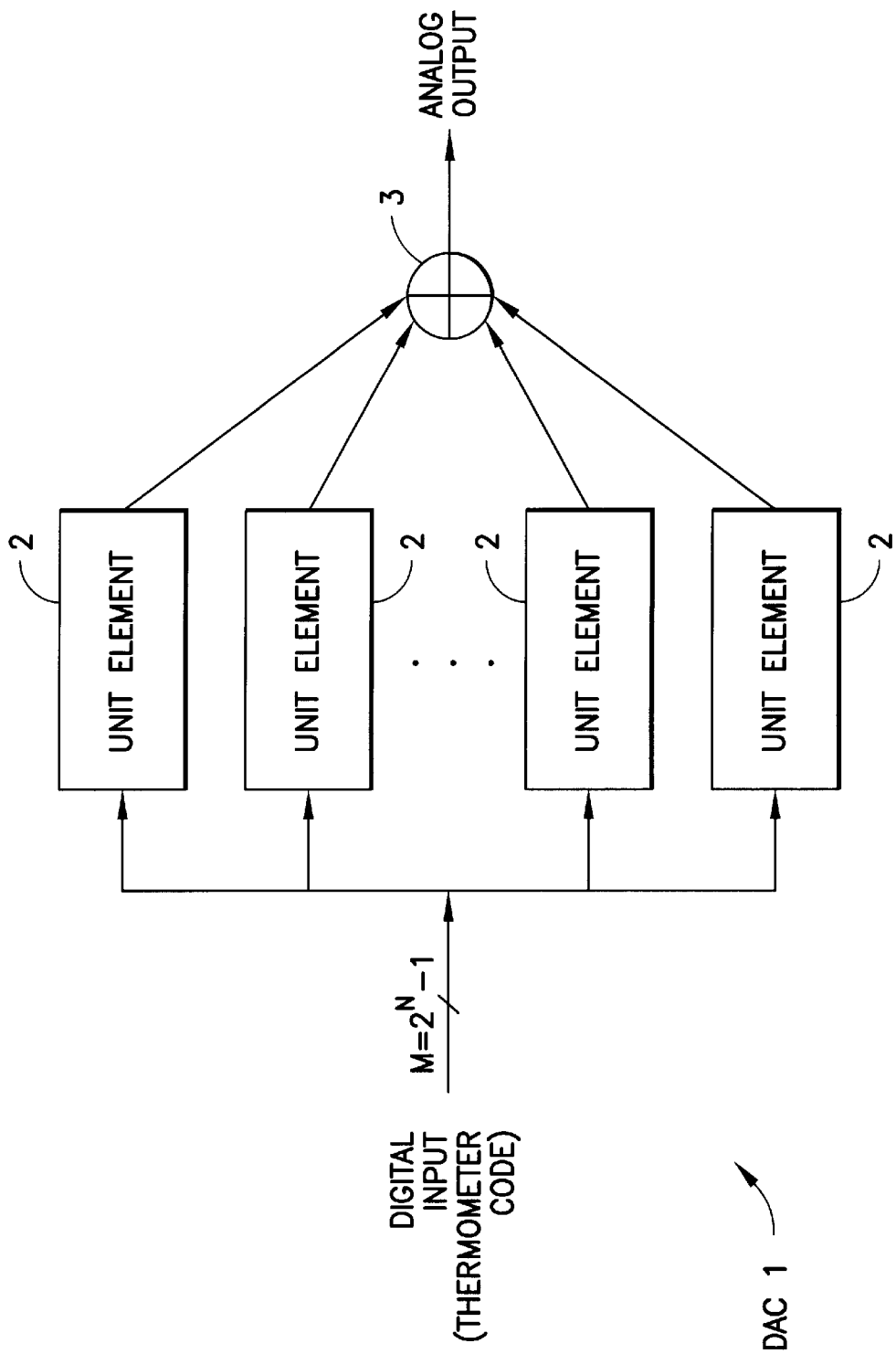
FIG. 1 is a simplified block diagram of a conventional multi-bit DAC that does not include a DEM algorithm block.
Figure 2:
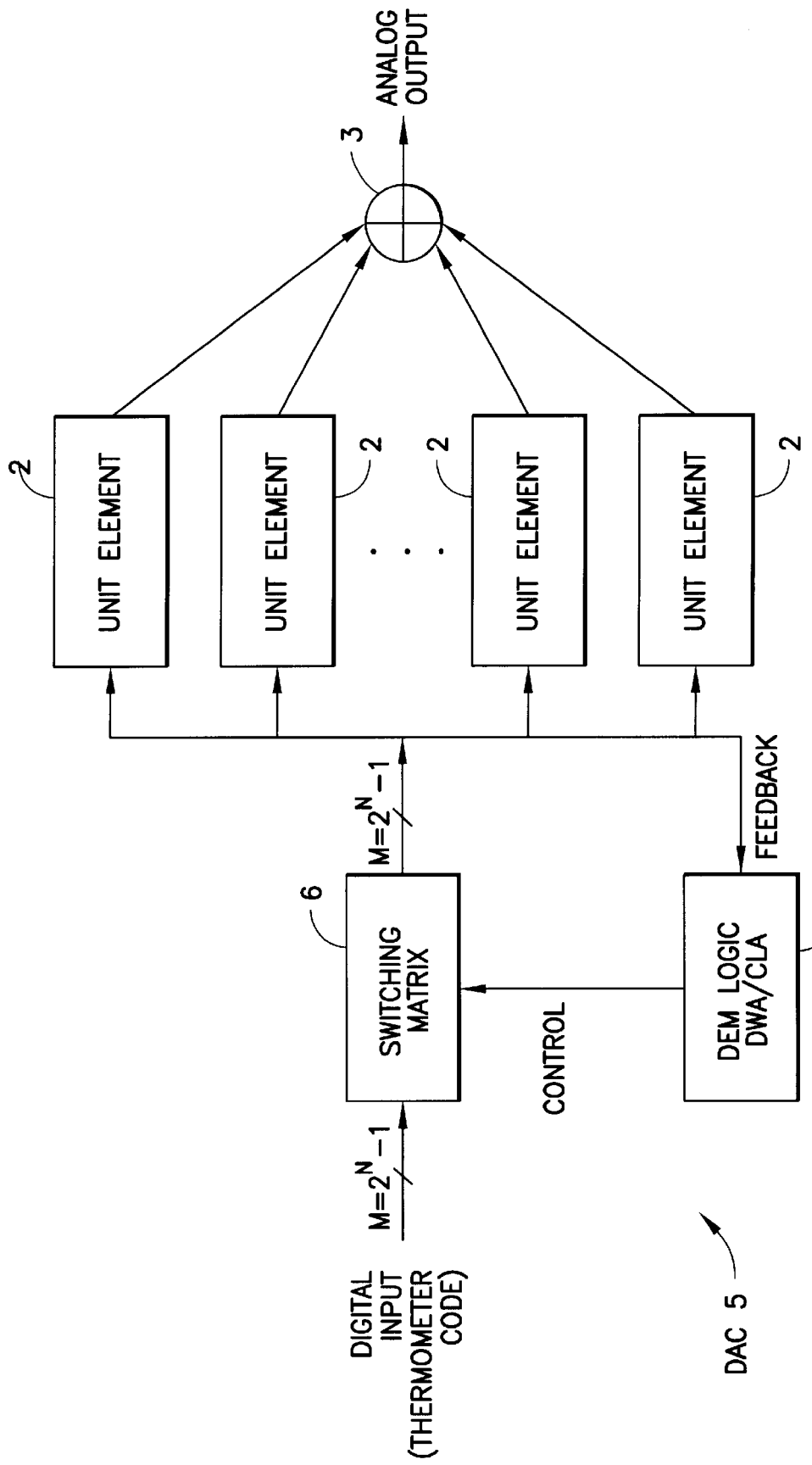
FIG. 2 is a simplified block diagram of a conventional multi-bit DAC that does include a cyclic DEM algorithm block.
Figure 3:
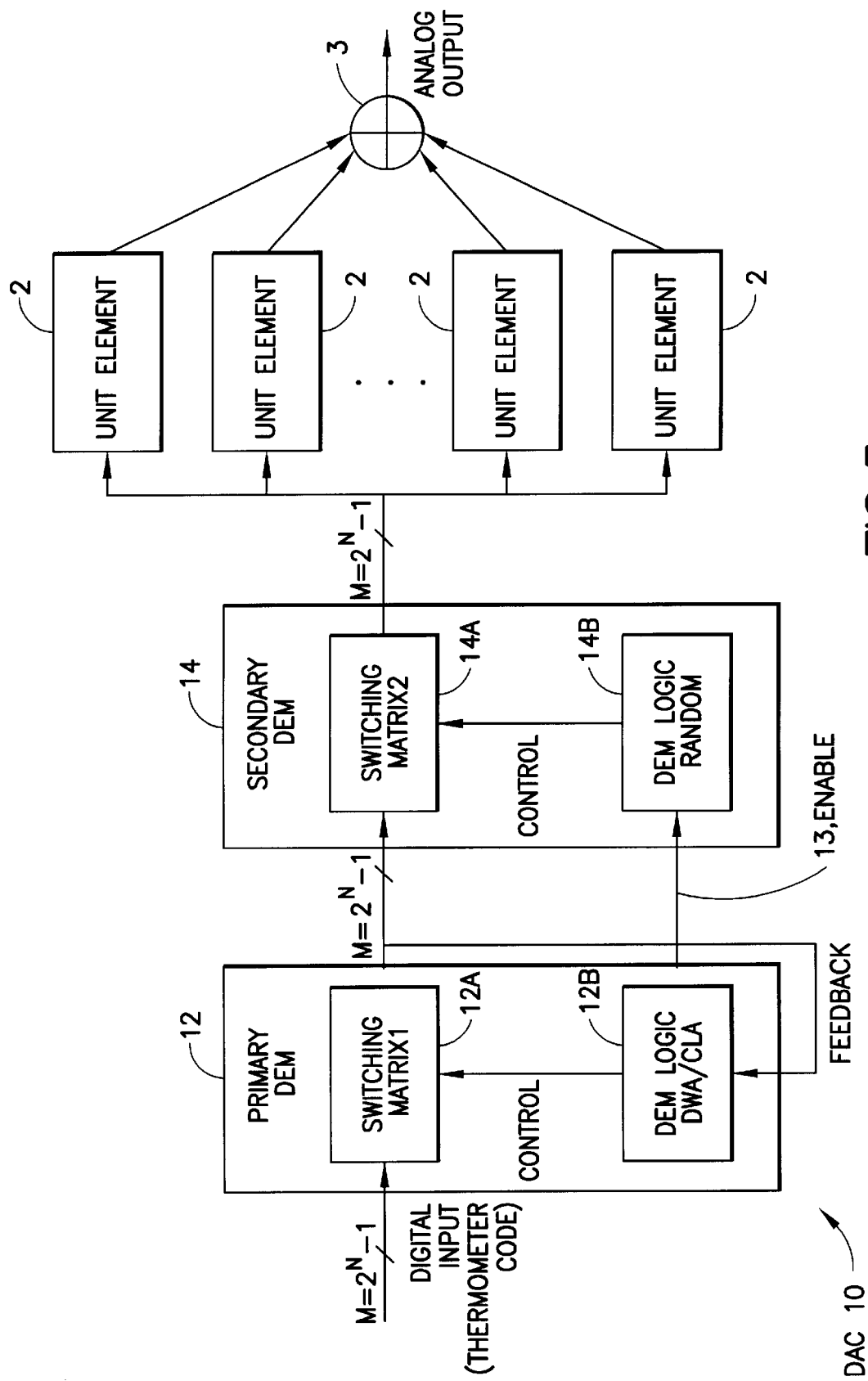
FIG. 3 is a block diagram of a multi-bit DAC that is constructed in accordance with these teachings to include a primary DEM algorithm block and a secondary DEM algorithm block which functions to decompose the tones of the cyclic DEM algorithm.

FIG. 3 is a block diagram of a multi-bit DAC 10 that is constructed in accordance with these teachings to include a primary DEM algorithm block 12 and a secondary DEM algorithm block 14. The secondary DEM block functions to decompose the tones of the cyclic DEM algorithm of the first DEM block 12. The unit elements 2 and summation node 3 can be the same as in FIGS. 1 and 2, and are numbered accordingly.

In FIG. 3 the thermometer code digital input signal is connected to the primary DEM block 12, and the unit element mismatch error is converted into wide-band noise by re-ordering that occurs in a switching matrix1 12A, which is controlled by the DEM logic DWA/Rotation block 12B. The operation of the secondary DEM block 14 is synchronized by enable signal 13 to the operation of the primary DEM block 12. The synchronization controls the secondary DEM block 14 such that it changes the state of the switching matrix2 14A only when the usage of the elements is 2 is averaged over all of the elements 2, and thus the secondary DEM block 14 does not adversely affect the unit element averaging that results form the operation of the primary DEM algorithm 12B. This tends to preserve the possible noise shaping of the primary DEM algorithm 12B. However, the possible periodic error signal components, i.e., tones formed by the operation of the primary DEM algorithm 12B are broken each time a change of state is made to the secondary DEM switching matrix2 14A, under control of the secondary DEM logic (e.g., random) algorithm 14B. The secondary DEM algorithm 14B may be any suitable random or pseudo random switching sequence for converting the tones to wide-band noise.

FIG. 4 is a diagram that contrasts conventional DWA and the DWA with tone cancellation in accordance with these teachings, and thus illustrates the principle of operation of the DAC 10 of FIG. 3.

FIG. 4 assumes that input binary sequence (thermometer code) to the DAC 10 at Timesteps (T) 1–6 is periodic: e.g., 000011, 000111, 000001, 000011, 000111, 000001, . . . , and further assumes the use of six unit elements 2. More or less than this number of unit elements can be used, and more or less than six input bits can be employed. Furthermore, these teachings are not limited to expressing the input digital sequence in the thermometer code format, as other formats, such as two's complement, could be used as well.

Figure 5A:
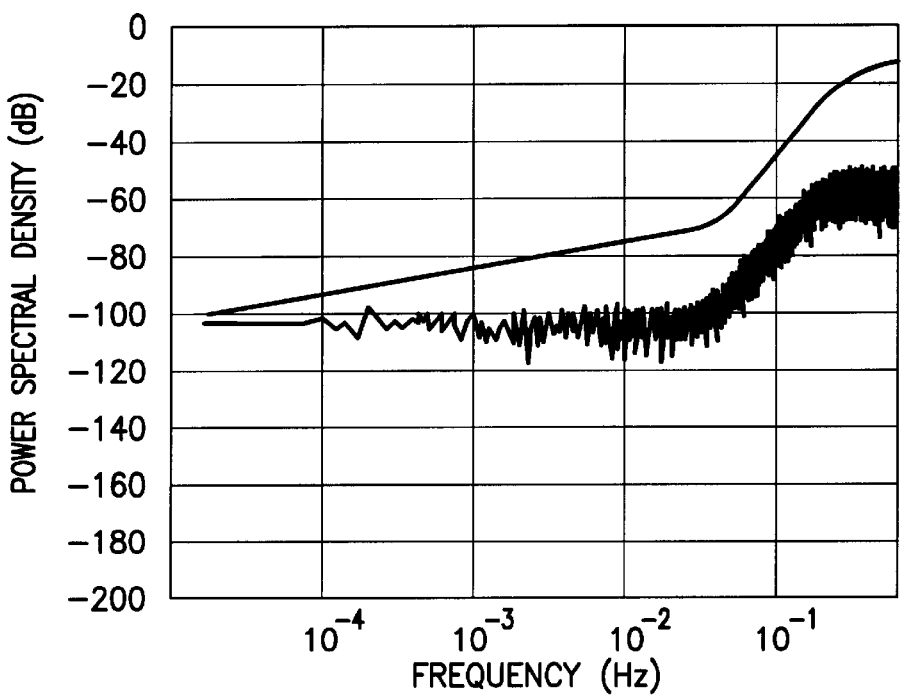
FIGS. 5A and 5B are power spectral density (dB) versus frequency plots and illustrate a performance comparison of conventional DEM algorithms in an ADC based on a $3^{rd}$ order SDM with an 8-level internal DAC, where
Figure 5B:
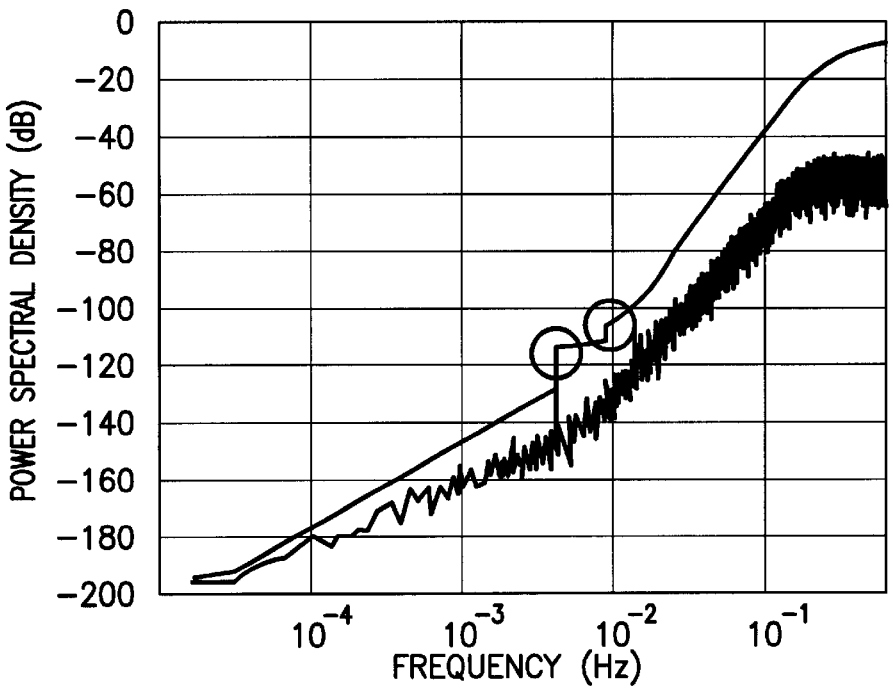
Figure 6:
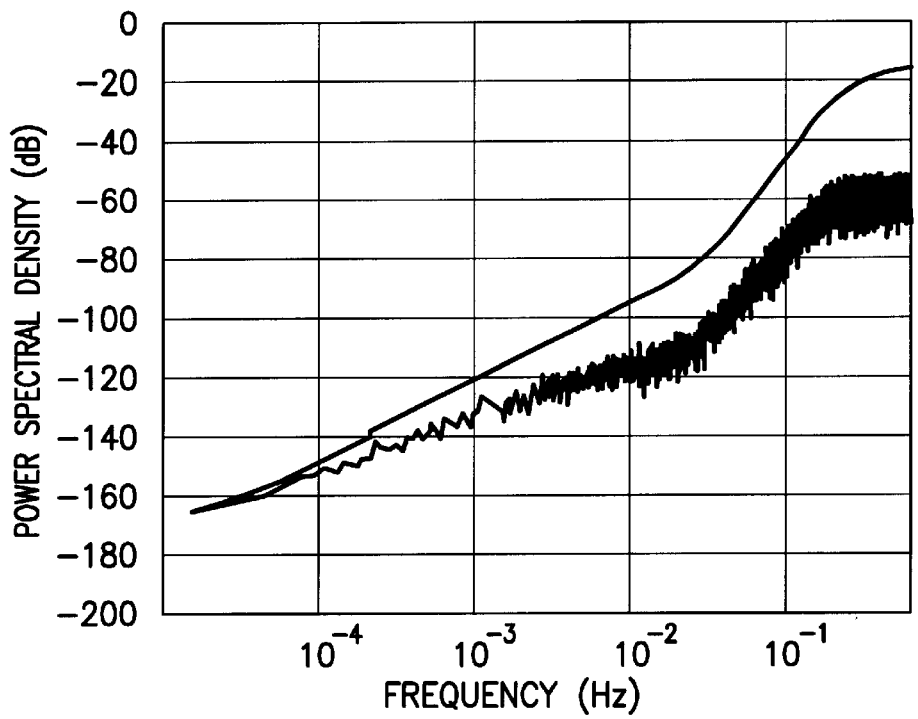
FIG. 6 is power spectral density (dB) versus frequency plot showing the performance of a DWA primary DEM algorithm with tone cancellation provided by a secondary DEM algorithm in accordance with these teachings.

In the DWA the mismatch error has the same period as the input data sequence. When the order of the elements is changed after all of the elements are used the same number of times (i.e., the element usage is averaged) the pointer value (Ptr) is one. At this time the state of the Enable signal 13 is changed to indicate to the secondary DEM algorithm 14B that the error sequence can be changed. This beneficially breaks the periodic mismatch error sequence (tones) in the DWA algorithm when a periodic or constant signal is applied to the DAC 10 input. However, note that the integral mismatch error is not changed, which implies that the changing of the unit element 2 order by the randomizing action of the secondary DEM algorithm 14B does not disturb the averaging operation of the primary DEM algorithm 12B, and thus the noise-shaping is also undisturbed. What occurs is that the tones are converted to wide-band noise by a rearrangement of the unit element 2 order by the secondary DEM algorithm 12B, and are thus cancelled, as c an be seen by comparing FIG. 6 with FIG. 5B.

Figure 7:
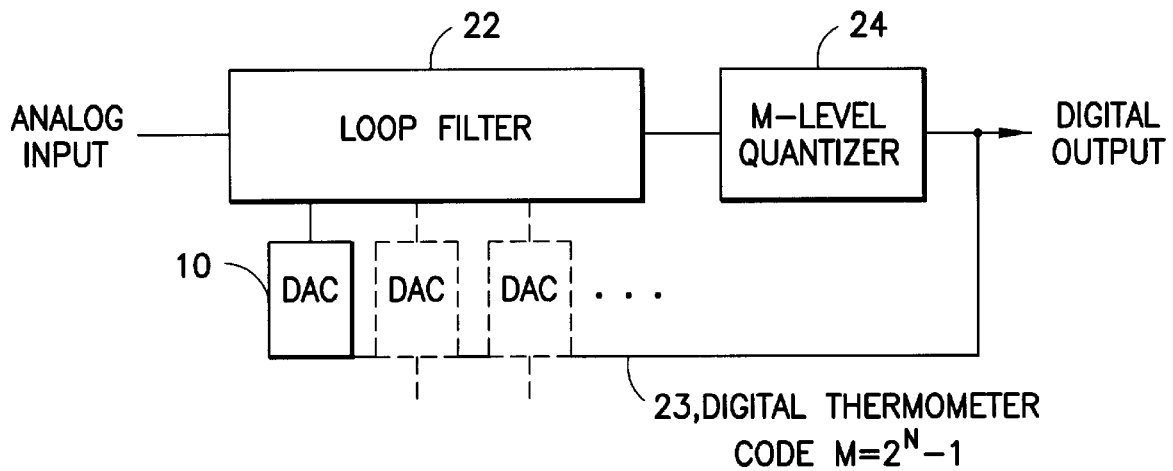
FIG. 7 is a block diagram of a sigma-delta ADC that includes the multi-bit DAC of FIG. 3 in a feedback loop.

FIG. 7 is a block diagram of a sigma-delta ADC or modulator 20 that includes the multi-bit DAC 10 of FIG. 3 in a feedback loop. The sigma-delta modulator of (SDM) 20 includes a loop filter 22, typically comprised of a chain of integrators, 1; and a multi-level quantizer 24. A feedback path 23 exists from the digital output of the quantizer 24 to the loop filter 22, and includes one or more of the DACs 10, depending on the SDM circuit topology. This is, of course, only one exemplary application for the DAC 10 in accordance with these teachings.

These teachings thus pertain as well to a method for performing Dynamic Element Matching, where the method operates to input a plurality of digital values and, for each value, to generate a plurality of N signals individual ones of which are intended to drive one of a plurality of the N elements 2. The plurality of signals are generated so as to average the usage of individual ones of the N elements 2 over time. The method further periodically rearranges the plurality of N signals so as to suppress the generation of undesired periodicities or tones in the usage of the N elements, and without affecting the averaging of the usage of the N elements 2. Preferably the periodic rearrangement occurs only at a time when the usage of the N elements is indicated as being averaged using, for example, the enable signal 13. The plurality of N signals are preferably generated by the primary DEM block 12 using a cyclic DEM algorithm 12B, such as a Data Weighted Averaging (DWA) algorithm or a rotation-based Clocked Averaging (CLA) algorithm, and the periodic rearrangement performed by the secondary DEM block 14 is preferably based o n randomization or pseudo-randomization.

While these teachings have been particularly shown and described with respect to preferred embodiments thereof, it will be understood by those skilled in the art that changes in form and details may be made therein without departing from the scope and spirit of these teachings.

What is claimed is:

1. A method for performing Dynamic Element Matching, comprising:

inputting a plurality of digital values and, for each value, generating a plurality of N signals individual ones of which are intended to drive one of a plurality of N elements, the plurality of signals being generated so as to average the usage of individual ones of the N elements over time; and periodically rearranging the plurality of signals so as to suppress the generation of undesired periodicities in the usage of the N elements.

2. A method as in claim 1, wherein the periodic rearrangement occurs only at a time when the usage of the N elements is averaged.

3. A method as in claim 1, wherein the plurality of N signals are generated using a cyclic DEM algorithm.

4. A method as in claim 1, wherein the plurality of N signals are generated using a Data Weighted Averaging (DWA) algorithm.

5. A method as in claim 1, wherein the plurality of N signals are generated using a rotation-based Clocked Averaging (CLA) algorithm.

6. A method as in claim 1, wherein the periodic rearrangement is based on randomization or pseudo-randomization.

7. A method for performing Dynamic Element Matching, comprising:

inputting a plurality of digital values and, for each value, generating a plurality of N signals individual ones of which are intended to drive one of a plurality of N elements, the plurality of signals being generated so as to average the usage of individual ones of the N elements over time and to convert mismatches between the individual ones of the N elements to wide-band noise; and periodically randomizing the plurality of signals so as to suppress the generation of undesired tones in the wideband noise, without affecting the averaging of the usage of the N elements.

8. A method as in claim 7, wherein the periodic randomization occurs only at a time when the usage of the N elements is averaged.

9. A method as in claim 7, wherein the plurality of N signals are generated using a cyclic DEM algorithm.

10. A method as in claim 7, wherein the plurality of N signals are generated using a Data Weighted Averaging (DWA) algorithm.

11. A method as in claim 7, wherein the plurality of N signals are generated using a rotation-based Clocked Averaging (CLA) algorithm.

12. Dynamic Element Matching (DEM) apparatus, comprising:

a first DEM block having an input for receiving a plurality of digital values and an output that expresses, for each value, a plurality of N signals individual ones of which are intended to drive one of a plurality of N elements, the plurality of signals being generated in accordance with a first DEM algorithm so as to average the usage of individual ones of the N elements over time; and a second DEM block having an input coupled to said output of said first DEM block, said second DEM block operating in accordance with a second DEM algorithm to periodically rearrange the plurality of N signals so as to suppress the generation of undesired periodicities in the usage of the N elements, without affecting the averaging of the usage of the N elements.

13. DEM apparatus as in claim 12, wherein said DEM apparatus forms a part of a multi-bit digital-to-analog converter (DAC).

14. DEM apparatus as in claim 13, wherein said DAC comprises a feedback path in a multi-bit analog-to-digital converter (ADC).

15. DEM apparatus as in claim 13, wherein said DAC comprises a portion of a sigma-delta modulator (SDM).

16. DEM apparatus as in claim 12, wherein the periodic rearrangement occurs in response to a signal generated by said first DEM algorithm at a time when the usage of the N elements is averaged.

17. DEM apparatus as in claim 12, wherein said first DEM algorithm comprises a cyclic DEM algorithm.

18. DEM apparatus as in claim 12, wherein said first DEM algorithm comprises a Data Weighted Averaging (DWA) DEM algorithm.

19. DEM apparatus as in claim 12, wherein said first DEM algorithm comprises a rotation-based Clocked Averaging (CLA) DEM algorithm.

20. DEM apparatus as in claim 12, wherein said second DEM algorithm is based on randomization or pseudo-randomization.

* * * * *